United States Patent [19]

Lipp

[11] Patent Number: 5,037,771
[45] Date of Patent: Aug. 6, 1991

[54] METHOD FOR IMPLEMENTING GRID-BASED CROSSCHECK TEST STRUCTURES AND THE STRUCTURES RESULTING THEREFROM

[75] Inventor: Robert Lipp, Los Gatos, Calif.

[73] Assignee: Cross-Check Technology, Inc., San Jose, Calif.

[21] Appl. No.: 442,282

[22] Filed: Nov. 28, 1989

[51] Int. Cl.[5] ..................... H01L 21/70; H01L 27/00
[52] U.S. Cl. .......................................... 437/51; 437/7; 437/8; 437/57; 437/48; 324/158 R; 324/158 F
[58] Field of Search .................... 137/51, 7, 8, 57, 48; 356/201; 324/158 R, 158 F

[56] References Cited

U.S. PATENT DOCUMENTS

| | | | |
|---|---|---|---|
| 4,426,773 | 1/1984 | Hargis | 437/8 |
| 4,457,066 | 7/1984 | Rao et al. | 437/48 |
| 4,516,312 | 5/1985 | Tomita | 437/51 |
| 4,691,434 | 9/1987 | Percival et al. | 437/51 |
| 4,749,947 | 6/1988 | Gheewala | |
| 4,902,638 | 2/1990 | Muto | 437/8 |

FOREIGN PATENT DOCUMENTS

| | | | |
|---|---|---|---|
| 0347332 | 12/1989 | European Pat. Off. | 437/48 |
| 62-276852 | 12/1987 | Japan | 437/57 |

OTHER PUBLICATIONS

Y. Suehiro et al., "A 120K-Gate Usable CMOS Sea of Gates Packing 1.3M Transistors", *Proceedings of the IEEE* 1988 *Custom Integrated Circuits Conference*, pp. 20.5.1–20.5.4.

K. Sawada, "A 72K CMOS Channelless Gate Array with Embedded 1Mbit Dynamic RAM", *Proceedings of the IEEE* 1988 *Custom Integrated Circuits Conference*, pp. 20.3.1–20.3.4.

Primary Examiner—Brian E. Hearn
Assistant Examiner—Kevin Picardat
Attorney, Agent, or Firm—Townsend and Townsend

[57] ABSTRACT

Methods for fashioning CrossCheck testing structures allow the testing of high density integrated circuit structures to be made in a space efficient manner. In one method, sense lines and probe lines are disposed in different layers perpendicular to one another and a diffusion line is overlaid in such a manner as to form a sense transistor. In another method, a pair of probe lines are routed between each pair of cells in a manner to form a sense transistor. In still another embodiment circuit layout requires no modification to the basic macrocell structure and a metal interconnection layer is used to couple sense transistors to individual cells.

16 Claims, 7 Drawing Sheets

METHOD FOR IMPLEMENTING GRID-BASED CROSSCHECK TEST STRUCTURES AND THE STRUCTURES RESULTING THEREFROM

BACKGROUND OF THE INVENTION

The present invention is in the field of integrated circuit testing. More particularly it relates to methods for implementing CrossCheck integrated circuit testing structures and the apparatus resulting therefrom.

U.S. Pat. No. 4,749,947, issued on June 7, 1988 to T. Gheewala describes a grid-based CrossCheck testing structure for testing integrated circuits. The specification of that patent is incorporated herein in its entirety. The CrossCheck testing structure is a specific type of storage-free matrix structure suited to testing a large class of randomly addressable combinatorial and like digital logic circuits in large-scale integrated form. The CrossCheck testing structure may be implemented using any of several common methods used to fabricate integrated circuits. Several implementations of the test structure using different technologies are schematically illustrated in the '947 patent. These implementations comprise a sense transistor coupled both to a sense line and a point being probed electrically. The '947 patent does not show how the CrossCheck testing structure can be implemented in an area-efficient manner on an integrated circuit.

SUMMARY OF THE INVENTION

The present invention comprises several methods to fabricate the CrossCheck testing structure in an area-efficient manner and the structures resulting therefrom.

The first method creates the CrossCheck test structure by routing the sense line in the first layer of interconnect metal. The probe line is routed in the polysilicon layer perpendicular to the sense line, both lines being adjacent to the cells in the cell array. A diffusion line is extended from a diffusion zone to the sense line and coupled thereto. This diffusion line is then overlaid with a tab area extending from the probe line, forming the probe transistor.

The second method creates the CrossCheck testing structure by routing a pair of probe lines between each pair of cells. The probe lines overlay an extension of the diffusion zones, thereby creating the sense transistors. The sense line extends over the cells in the first metal interconnect layer and is perpendicular to the probe lines. This second method is particularly advantageous when contact with the substrate is necessary.

The third method for implementing the CrossCheck testing structure is advantageous in that there is no alteration to the pre-existing laid-out logic macrocells. The sense transistors are removed from the basic cell structure and the metal interconnection layer is used to couple the sense transistors to the individual cells. As in the first and second methods, the probe lines and sense lines run perpendicular to one another through the array.

Many variations to the disclosed methods are readily envisioned and are consequently within the scope of this invention. The CrossCheck testing structures which result from following these methods are also within the scope of this invention. The three specifically disclosed methods will now be described in detail in conjunction with FIGS. 1 through 7, described briefly below.

DETAILED DESCRIPTION OF THE PREFERRED EMBODIMENTS

Figure 1A:
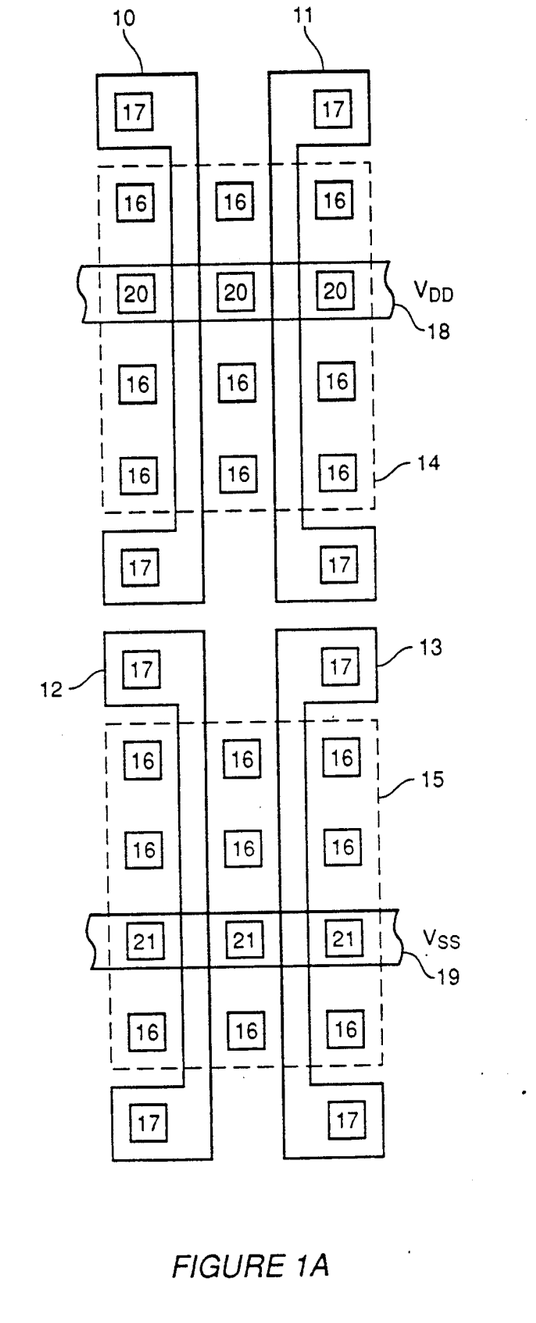
FIG. 1a is a typical CMOS gate array basic core cell.
Figure 1B:
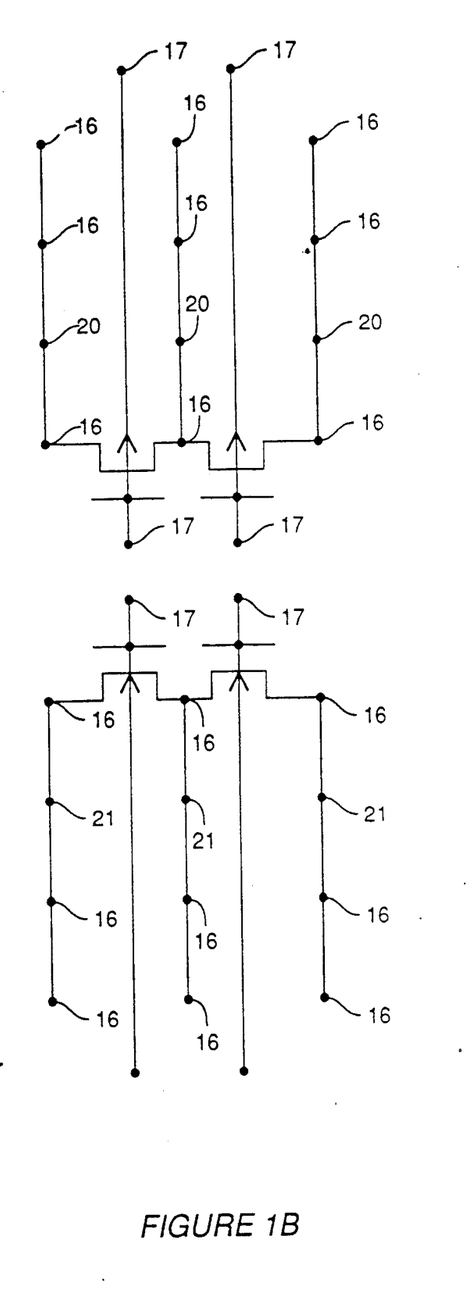
FIG. 1b shows the core cell of FIG. 1a in a schematic form.

FIG. 1a shows a typical CMOS gate array cell comprised of 4 MOS transistors. Two P-channel transistors are formed by the intersection of polysilicon gates 10 and 11 with P diffusion zone 14. Two N-channel transistors are formed by the intersection of polysilicon gates 12 and 13 with N diffusion zone 15. Power supply lines $V_{DD}$ 18 and $V_{SS}$ 19 cross over the cell in the first metal layer interconnect. Optional contacts 20 couple power supply $V_{DD}$ 18 to P diffusion region 14. Optional contacts 21 couple power supply line $V_{SS}$ 19 to N diffusion region 15. Connections to the gate electrodes of the transistors can be formed through optional contacts 17. The source/drain connections can be formed through optional contacts 16. The schematic equivalent of the cell shown in FIG. 1a is shown in FIG. 1b.

Figure 2:
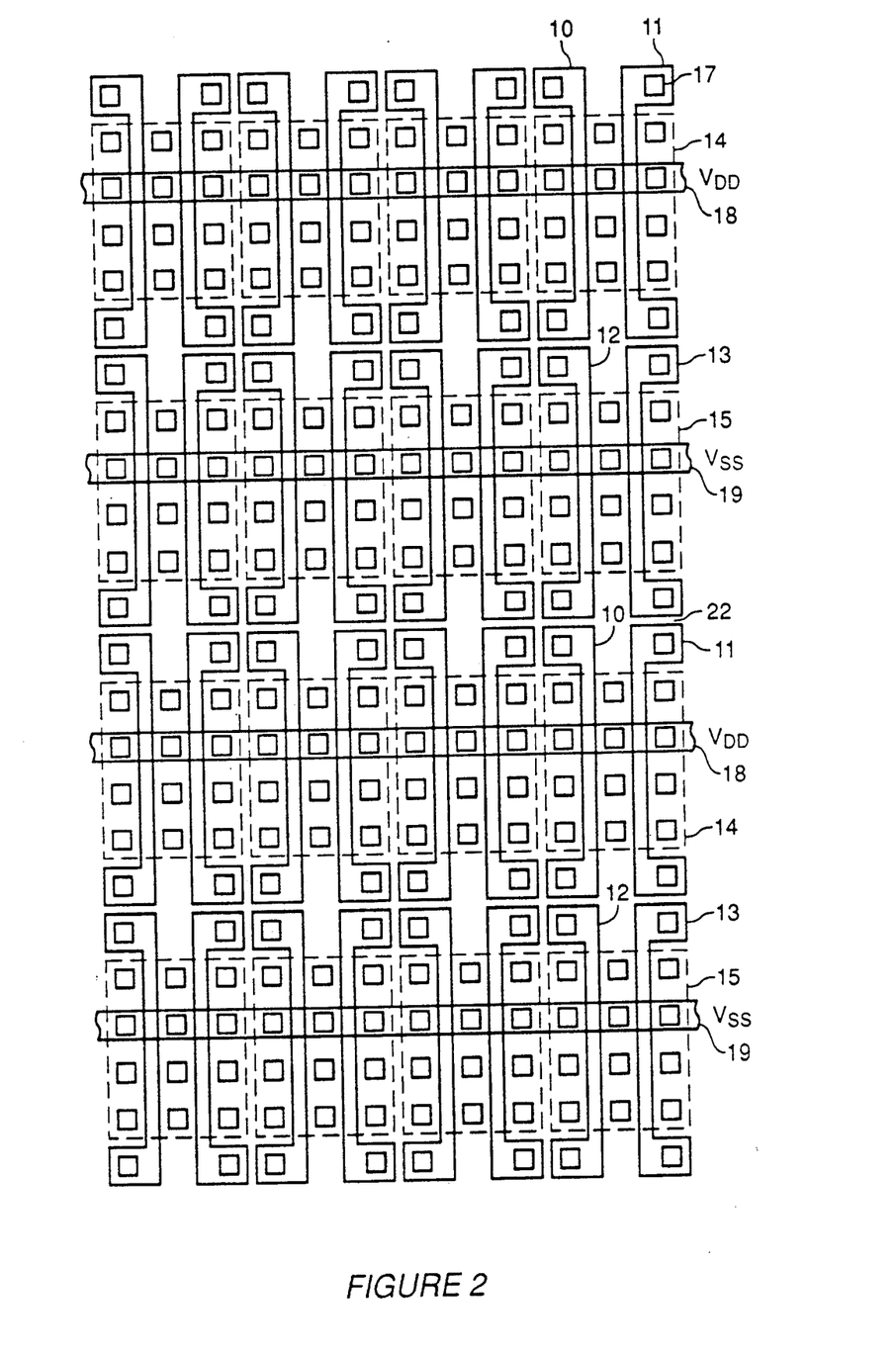
FIG. 2 is the gate array cell of FIG. 1 arrayed to form a section of the core area of a gate array.
Figure 3:
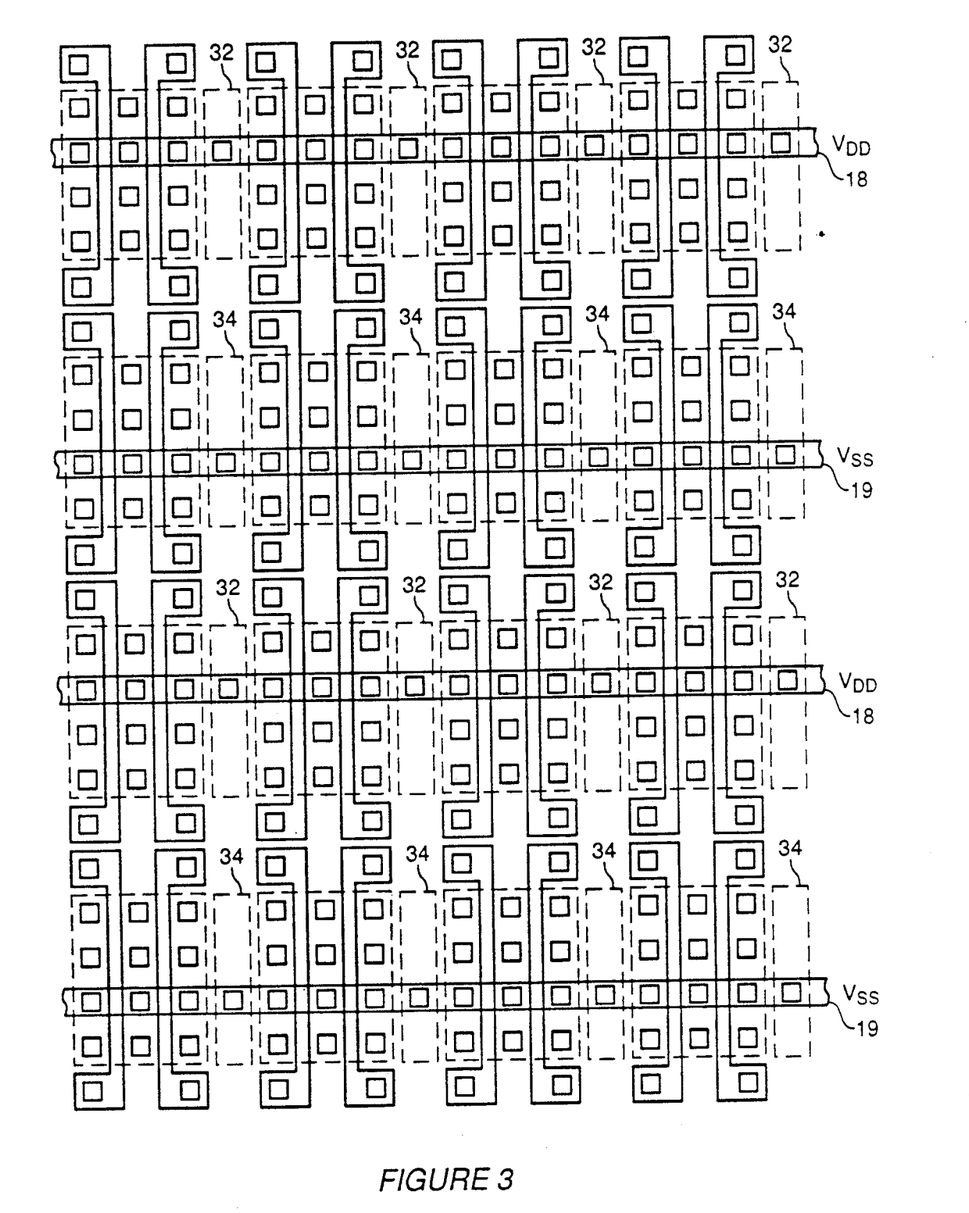
FIG. 3 is the gate array of FIG. 2 as it is commonly modified to include well diffusions for connection to the power supply and ground.

FIG. 2 (wherein like structures are like numbered as in FIG. 1) shows how a plurality of the cells shown in FIG. 1 could be arranged to form the core area of a gate array. The array shown is a sea-of-gates array with no predefined routing area. A space 22 could be widened to create a predefined wiring channel area, thereby creating a channeled array. The type of array shown in FIG. 2 is not commonly used as there is no simple way to couple the substrate to the power and ground sources. FIG. 3 shows how the array of FIG. 2 is commonly modified to couple the P and N substrates to $V_{DD}$ 18 and $V_{SS}$ 19 using respective diffusion zones 32 and 34.

The CMOS methods described herein which implement CrossCheck testing structures require that the sense lines be routed in the first metal interconnect layer and that the probe lines be routed perpendicular to the sense lines in the polysilicon layer. The sense transistors can be either N-type or P-type. For illustration purposes, the transistors will be assumed to be P-type, but they could just as easily be N-type with all other structures built in a complementary fashion.

Figure 4:
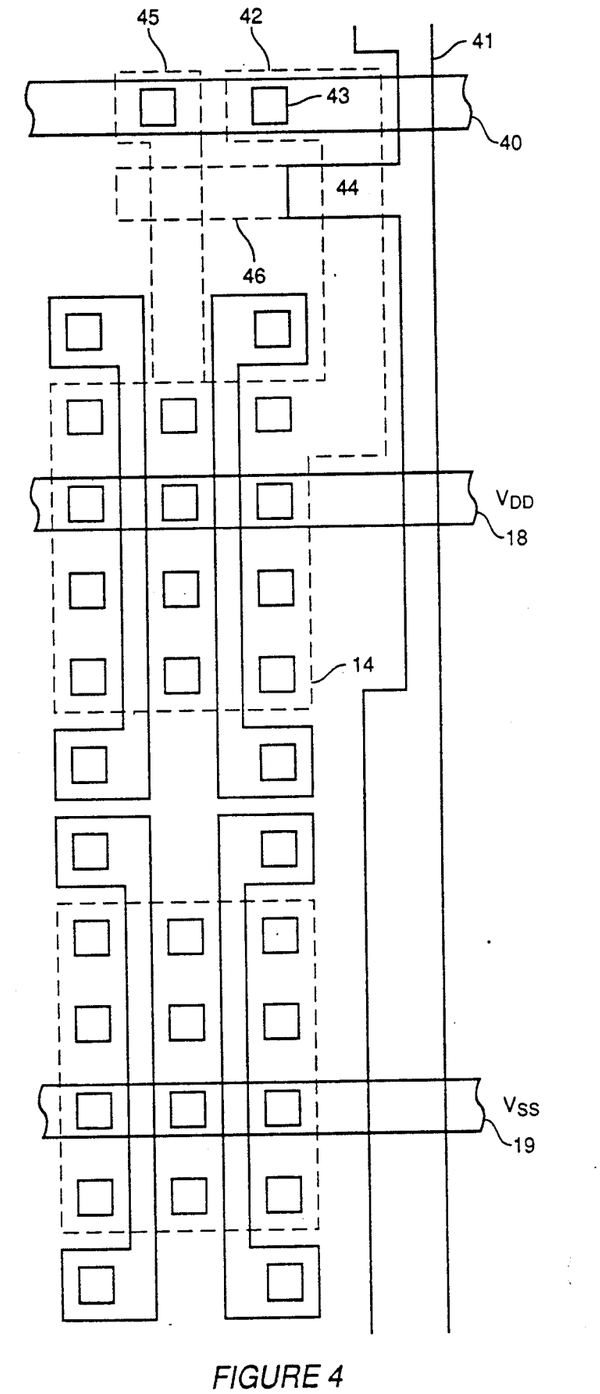
FIG. 4 shows a CrossCheck structure created by using a first embodiment of the present invention.

FIG. 4 illustrates the first method to implement the CrossCheck testing grid and the resulting structure. Again, like structures are like numbered with reference to FIGS. 1, 2 and 3. Sense line 40 is routed in the first layer of interconnect metal. Probe line 41 is routed in the polysilicon layer perpendicular to sense line 40. Both lines are adjacent to a cell in the cell array. Diffusion line 42 is extended from diffusion zone 14 to sense line 40 where a connection may be made to the sense line by means of contact 43. This contact may optionally be made part of the metalization pattern of the logic cell at that location. This diffusion line would be overlaid with a tab area 44 from polysilicon sense line 41, forming a sense transistor, the gate of which transistor is numbered 44 and the source being numbered 42 and drain 42 being integrated into the gate array logic cell. Other gate array diffusions 14 could be similarly extended (see dotted region 45) and overlaid with a further tab area extension 46 attached to tab area 44 from the polysilicon sense line to form a sense transistor attached to another location in the gate array logic cell.

Figure 5:
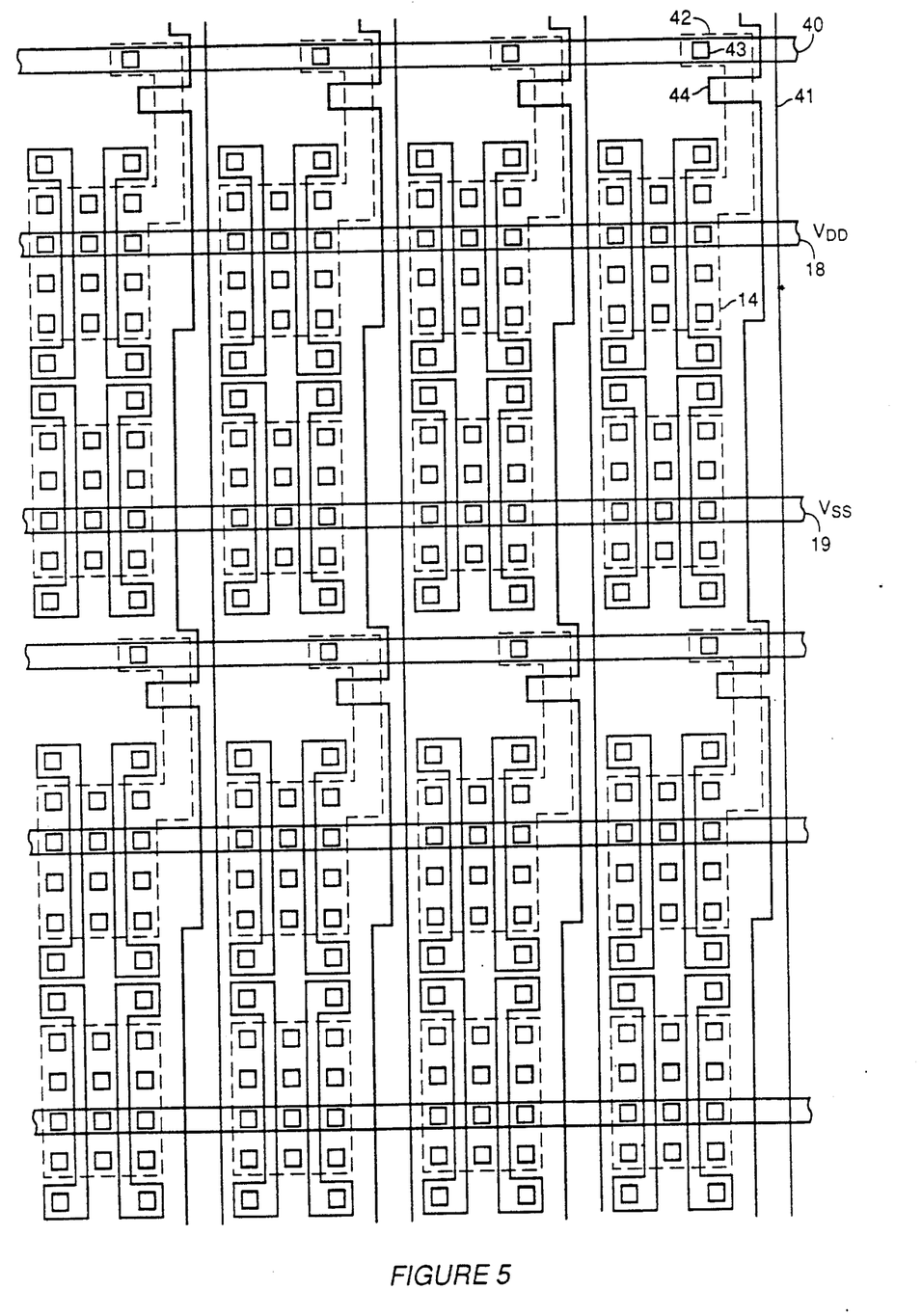
FIG. 5 is an array of cells and test structures created using the first method.

FIG. 5 shows an array of cells, the cells being similar to those shown in FIG. 4. In this embodiment, one extended metal sense line 40 and one extended polysilicon probe line 41 are coupled to a plurality of cells. The number of gates that can be integrated on a given CMOS gate array is usually limited by the number of transistors that can be interconnected by the resources provided by the metalization interconnect system. The metal sense line used in each cell reduces the metal interconnection resources available per unit area, and consequently reduces the number of transistors that can be interconnected by a proportionate amount. The proportionate reduction is usually small, generally in the 5% range. The polysilicon lines do not reduce the metalization resources and consequently do not reduce the number of transistors which may be interconnected.

The method just described causes a non-negligible performance degradation due to the need to add long diffusion extension 42 to couple the array transistors to the sense transistors.

Figure 6:
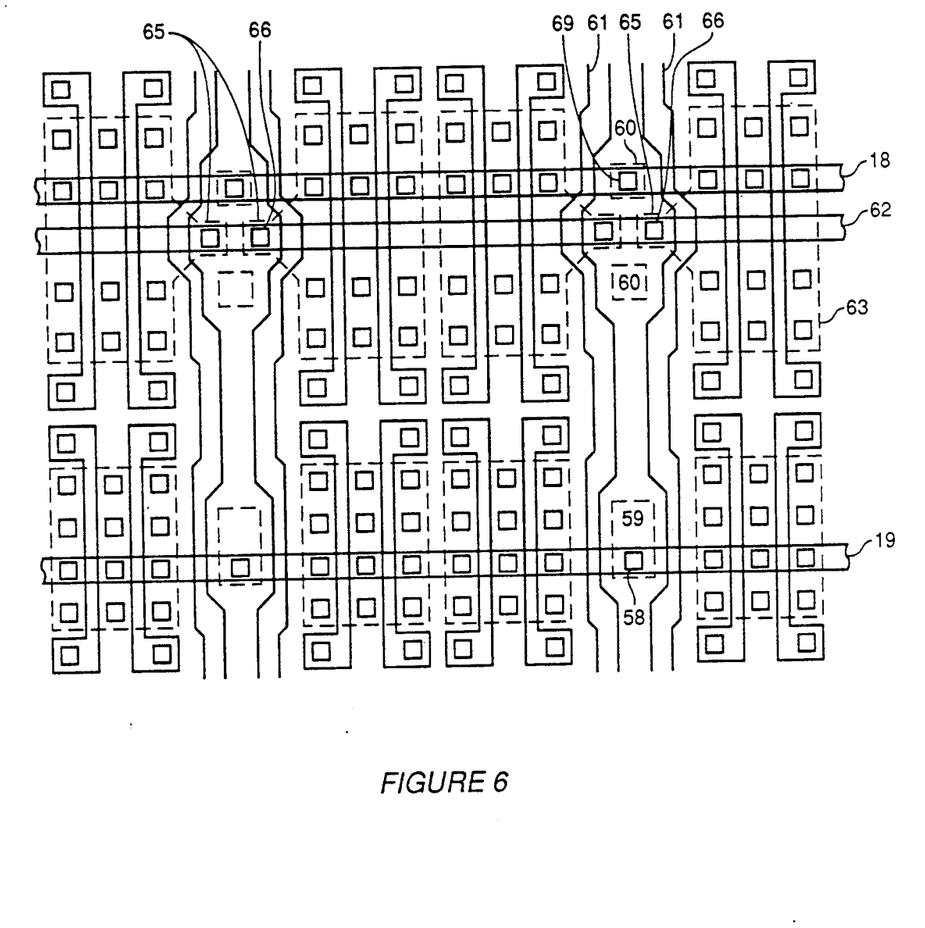
FIG. 6 shows an array of cells illustrating a second embodiment of the present invention.

FIG. 6 shows a second method for implementing CrossCheck technology. This method results in a structure similar to the structure shown in FIGS. 4 and 5 in that probe lines 61 and sense lines 62 are respectively routed perpendicularly to one another on the polysilicon and first metal interconnect layer respectively. This second method is advantageous when contact with the substrate is necessary. P-type diffusion zones 63 have been extended so as to make room for sense line 62 to extend over the cell rather than adjacent to it. Sense line 62 is shown here as adjacent to $V_{DD}$ power line 18. Sense transistor diffusion zone 65 is extended sideways from the cell to overlap probe line 61, creating a sense transistor.

The sense transistor is optionally connected to sense lines 62 with contact 66. Two probe lines 61 run between each pair of cells. The probe lines are mirror images of each other and, as previously stated, overlay the sense transistor diffusion zones 65, creating the sense transistor. This mirroring of the probe lines creates room for substrate diffusion zones 60 and 59 between every pair of cells without requiring that the pair of cells be spaced further apart than the original pair of cells shown in FIG. 3. Substrate diffusion zone 60 is coupled to $V_{DD}$ 18 through contact 69. Substrate diffusion zone 59 is coupled to $V_{SS}$ 19 through contact 58. The polysilicon sense line 61 thus fits into the original space provided for substrate contacts.

This second method offers some performance advantages over the first method. There is no performance degradation resulting from the capacitances created by additional diffusion extensions, which degradation does occur when using the first method, and the increased size of the P diffusion zones creates array transistors with greater drive and higher performance. Note that mirrored diffusion extensions 65 are illustrated as not connected to each other. In practice these diffusions extensions may be connected, eliminating the need for one contact 66.

Figure 7:
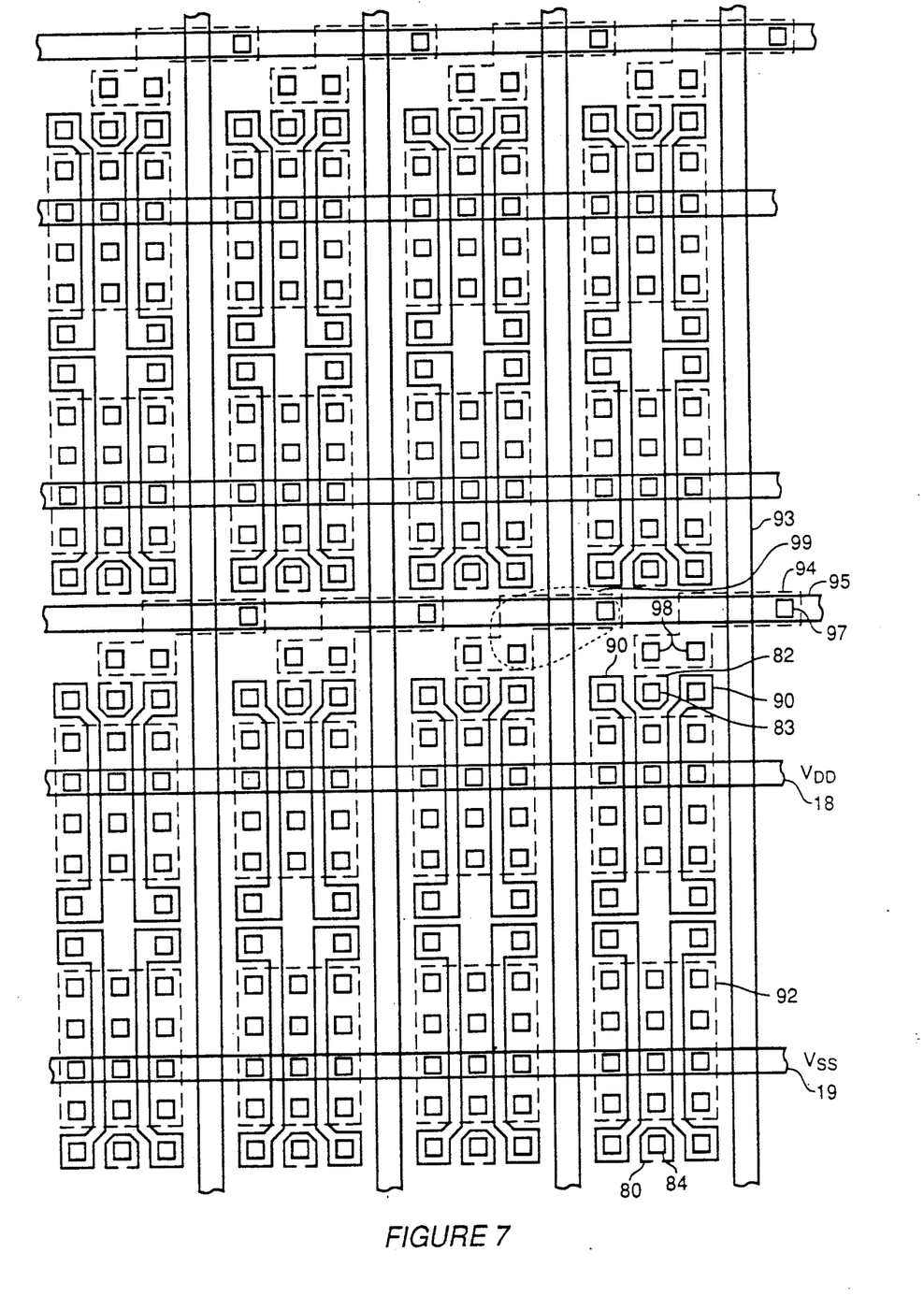
FIG. 7 shows an array of cells illustrating a third embodiment of the present invention.

A third method to implement CrossCheck testing structures is shown in FIG. 7. In the other gate array designs using CrossCheck testing structures, the sense transistors were built into the physical gate array structures, thereby altering the basic cell structure. A method of implementing CrossCheck which does not alter the pre-existing laid out logic macrocell is, however, desireable. This third method achieves this objective by removing the sense transistors from the basic cell structure and using the metal interconnection layers to make the connections from the sense transistors to the individual cells.

Having a flexible sense transistor connection scheme and minimizing the impact to existing physical structures is also desirable for some CMOS gate array structures, particularly if minimal impact to the macrocell metalization library is required. This third method presents a technique for implementing CrossCheck testing structures with CMOS gate arrays that meets these requirements.

FIG. 7 shows a basic gate array cell structure. In the basic cell, there are four polysilicon zones 90, a P diffusion zone 91 and an N diffusion zone 92. The intersection of the polysilicon zones member with the P diffusion zones forms two P type transistors. The intersection of the other polysilicon zones with the N diffusion zones forms the N type transistors. This basic cell is repeated at regular horizontal intervals to form a row of cells. The polysilicon probeline member 93 runs vertically throughout the length of the array. The zone 94 is a P type diffusion zone, although it could also be an N type diffusion zone. The intersection of probeline 93 and zone 94 forms sense transistor 99 with the probeline coupled to the sense transistor's gate electrode. Sense line 95 runs in the metal layer horizontally through the length of the array and passes over the drain terminal of sense transistor 99. A contact 97 between the sense line and the drain of the sense transistor may be made. The source of the sense transistor 99 is not connected in the base layers and has multiple contact points 98.

In such a structure, the connection between the point in the logic cell to be tested and the source of the sense transistor must be made with a metal interconnect. The appropriate metal interconnect may be added to each macrocell metalization pattern in the computer library for the particular array, or the software which controls logic cell to logic cell routing connections might be used to make the connection.

The advantage of such a structure is that the macrocell metalization pattern in the library for the particular array need not be altered to accommodate the CrossCheck test structures.

In this method the substrate connections illustrated in FIG. 3 as 32 and 34 have been moved from between the cells to make room for polysilicon lines 93. These diffusions have been moved to locations at the end of the cell and are labelled as 82 and 80 respectively. They can be connected to $V_{DD}$ or $V_{SS}$ by contacts 83 and 84 respectively.

The described methods illustrate the implementation of CrossCheck testing structures in the specific regular structure of a gate array. The same methods could be applied to a semi-regular structure such as a standard cell or used with compiled cell design technology.

Although the invention has been particularly shown and described with reference to preferred embodiments thereof, it will be understood by those skilled in the art that the foregoing and other changes in the form and details may be made therein without departing from the spirit and scope of the invention. Therefore, it is not intended that the invention be limited except as indicated by the appended claims.

I claim:

1. A method for incorporating CrossCheck testing structures in an array of CMOS gate cells, each cell being formed from at least a first metal interconnect layer, a diffusion layer, a means to connect the diffusion layer to the metal interconnect layer by a contact layer, and a first polysilicon layer, each cell comprising a plurality of CMOS transistors, each transistor having a diffusion zone and a transistor gate region formed by the overlap of the polysilicon layer over the diffusion zone, the method comprising:

creating a first and second channel on a first and second side of each cell, the two channels being adjacent to a plurality of cells arranged in a matrix, the channels being perpendicular to each other;

forming a sense line in the first metal interconnect layer, the sense line being located within the first channel;

forming a diffusion extension from one transistor diffusion zone in each cell adjacent to the first channel and extending to the sense line and coupled to it by a first contact;

forming a probe line in the polysilicon layer, the probe line being located within the second channel, the probe line being perpendicular to the sense line; and forming a sense transistor between the cell diffusion layer and the sense line contact by a tab means extending from the probe line and overlaying the diffusion extension, forming the gate of the transistor, the sense transistor being formed by the tab means, diffusion line and the first contact.

2. A method for incorporating CrossCheck testing structures in an array of gate cells in an integrated circuit containing at least a first metal interconnect layer, a diffusion layer, a means to connect the diffusion layer to the metal interconnect layer by a contact layer, and a first polysilicon layer, such layers by themselves or with other layers capable of being combined to form MOS transistors which can be coupled to the cells by the diffusion layer, each cell comprising a plurality of transistors having diffusion zones, the method comprising:

creating a first and second channel on two perpendicular sides of each cell, the two channels being adjacent to a plurality of cells arranged in a matrix;

forming a sense line in the first metal interconnect layer, the sense line being located within the first channel;

forming a diffusion extension from one transistor diffusion zone in each cell adjacent to the channel in which the sense line is located and extending to the sense line and coupled to it by a first contact;

forming a probe line in the polysilicon layer, the probe line being located within the second channel, the probe line being perpendicular to the sense line; and forming a sense transistor between the diffusion extension and the sense line contact by a tab means extending from the probe line and overlaying the diffusion extension, forming the gate of the transistor, the sense transistor being formed by the tab means, diffusion extension and the first contact.

3. The method of claim 1 wherein each cell is comprised of 4 CMOS transistors.

4. A method for incorporating CrossCheck testing structures in an array of CMOS gate cells, each cell being formed from at least a first metal interconnect layer, a diffusion layer, a means to connect the diffusion layer to the metal interconnect layer by a contact layer, and a first polysilicon layer, each cell comprising a plurality of CMOS transistors, each transistor having a diffusion zone, the method comprising:

creating one channel between groups of two cells;

forming a pair of probe lines in the channel between the cells, each probe line being substantially the mirror image of the other and the probe lines being formed in the polysilicon layer;

forming a sense line in the first metal interconnect layer, the sense line being perpendicular to the probe lines and extending over the cells; and forming a sense transistor by means of forming a diffusion extension from one transistor diffusion zone in each cell adjacent to the channel in which the probe lines are located and extending under the probe line, the intersection of the probe line and diffusion extension forming the gate of the transistor, and connecting the sense transistor to the sense line by a first contact overlying the diffusion extension where the diffusion extension underlies the sense line.

5. A method for incorporating CrossCheck testing structures in an array of gate cells in an integrated circuit containing power and ground supplies, at least a first metal interconnect layer, power and ground interconnect lines, a diffusion layer, a means to connect the diffusion layer to the metal interconnect layer by a contact layer, and a first polysilicon layer, such layers by themselves or with other layers capable of being combined to form MOS transistors which can be coupled to the cells by the diffusion layer, each cell comprising a plurality of transistors, each transistor having a diffusion zone, the method comprising:

creating one channel between groups of two cells;

forming a pair of probe lines in the channel between the cells, each probe line being substantially the mirror image of the other and the probe lines being formed in the polysilicon layer;

forming a sense line in the first metal interconnect layer, the sense line being perpendicular to the probe lines and extending over the cells; and forming a sense transistor by means of forming a diffusion extension from one transistor diffusion zone in each cell adjacent to the channel in which the probe lines are located, the extension extending under the probe lines, the intersection of the probe line and diffusion extension forming the gate of the transistor, and connecting the sense transistor to the sense line by a first contact overlaying the diffusion extension where the diffusion extension underlies the sense line.

6. The method of claim 4 wherein each cell is comprises four CMOS transistors.

7. The method of claim 4 wherein the probe lines are formed in such a manner as to provide space for a plurality of secondary diffusion zones to be placed between the probe lines and below the ground and power interconnect lines, such secondary diffusion zones being used to periodically couple the power and ground supplies to the integrated circuit substrate regions in which the transistors are embedded by means of a contact to these power and ground interconnect layers.

8. The method of claim 5 wherein the probe lines are formed in such a manner as to provide space for a plurality of secondary diffusion zones to be placed between the probe lines and below the power and the ground interconnect lines, such secondary diffusion zones being used to periodically couple the power and ground supplies to he integrated circuit substrate regions in which the transistors are embedded by means of a contact to these power and ground interconnect layers.

9. The method of claim 6 wherein the probe lines are formed in such a manner as to provide space for a plurality of secondary diffusion zones to be placed between the probe lines and below the power and the ground interconnect lines, such secondary diffusion zones being used to periodically couple the power and ground supplies to the integrated circuit substrate regions in which the transistors are embedded by means of a contact to these power and ground interconnect layers.

10. A method for incorporating CrossCheck testing structures in an array of gate cells, each cell being formed from at least a first metal interconnect layer, a second interconnect layer, a diffusion layer, a means to connect the diffusion layer to the metal interconnect layer by a contact layer, each cell comprising a plurality of transistors, the method comprising:
   forming empty channels along each side of each cell;
   forming sense lines in the first metal interconnect layer in the channels running in the X direction between the cells;
   forming probe lines by means of the second interconnect layer in the channels running in the Y direction along the side of each cell; and
   forming a sense transistor with a control terminal, an output terminal, and an input terminal in proximity to each intersection of the sense lines and the probe lines, the probe lines being connected to the control terminal of the transistor, the sense line being connected to the output terminal of the transistor, and the input terminal of the transistor being connected to one of the gate cells.

11. The method of claim 10 wherein the sense transistor is an MOS transistor.

12. The method of claim 11 wherein the second interconnect layer is polysilicon, the second interconnect layer also forming the gate of the MOS sense transistor.

13. The method of claim 10 wherein each cell comprises 4 CMOS transistors.

14. The method of claim 10, wherein the second interconnect layer is metal.

15. A method for incorporating CrossCheck testing structures in an array of gate cells in an integrated circuit containing power and ground supplies, at least a first metal interconnect layer, power and ground interconnect lines, a diffusion layer, a means to connect the diffusion layer to the metal interconnect layer by a contact layer, and a first polysilicon layer, such layers by themselves or with other layers capable of being combined to form MOS transistors which can be coupled to the cells by the diffusion layer, each cell comprising a plurality of transistors, the transistors having diffusion zones, the method comprising:
   creating a channel between groups of two cells;
   forming a plurality of probe lines in the channel between the cells, the probe lines being formed in the polysilicon layer;
   forming a sense line in the first metal interconnect layer, the sense line being perpendicular to the probe lines and extending over the cells; and
   forming a sense transistor by means of forming a diffusion extension from one transistor diffusion zone in each cell adjacent to the channel in which the probe lines are located and extending under the probe lines, the intersection of the probe lines and diffusion extension forming the gate of the transistor, and connecting the sense transistor to the sense line contact by a first overlaying the diffusion extension where the diffusion extension underlies the sense line.

16. A method for incorporating the CrossCheck testing structures in an array of gate cells, each cell being formed from a least a first metal interconnect layer, a second interconnect layer, a diffusion layer, a contact layer to connect the diffusion layer to the metal interconnect layer, each cell comprising a plurality of transistors, the transistors having diffusion zones, the method comprising:
   forming at least a first channel along one side of each cell;
   forming sense lines in the first metal interconnect layer and extending over the gate cells;
   forming probe lines in the first channel in the second interconnect layer, the probe lines being perpendicular to the sense lines; and
   forming a sense transistor with a control terminal, an output terminal, and an input terminal in proximity to the intersection of the sense and probe lines, the probe line being coupled to the control terminal, the sense line being coupled to the output terminal, and the input terminal being coupled to one of the gate cells.

* * * * *